(12) United States Patent
Muro et al.

(10) Patent No.: US 7,919,716 B2
(45) Date of Patent: Apr. 5, 2011

(54) PRINTED WIRING BOARD AND ELECTRONIC APPARATUS

(75) Inventors: Kiyomi Muro, Hachioji (JP); Gen Fukaya, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/580,124

(22) Filed: Oct. 15, 2009

(65) Prior Publication Data

US 2010/0132981 A1 Jun. 3, 2010

(30) Foreign Application Priority Data

Nov. 28, 2008 (JP) ................. 2008-304695

(51) Int. Cl.
*H05K 1/11* (2006.01)
*H01R 12/04* (2006.01)
(52) U.S. Cl. ...................... 174/261; 361/792
(58) Field of Classification Search ............ 174/250, 174/254, 261; 361/792–795
See application file for complete search history.

(56) References Cited

U.S. PATENT DOCUMENTS

| | | | | |
|---|---|---|---|---|
| 6,496,377 B1 * | 12/2002 | Happ et al. | ...... | 361/739 |
| 6,657,130 B2 * | 12/2003 | Van Dyke et al. | ...... | 174/255 |
| 6,707,685 B2 * | 3/2004 | Kabumoto et al. | ...... | 361/794 |

FOREIGN PATENT DOCUMENTS

| | | |
|---|---|---|
| JP | U 56-96667 | 7/1981 |
| JP | 61-24295 | 2/1986 |
| JP | 02-060185 | 2/1990 |
| JP | 05-299785 | 11/1993 |
| JP | 08-153938 | 6/1996 |
| JP | 2001-210917 | 8/2001 |
| JP | 2002-261402 | 9/2002 |
| JP | 2006-278747 | 10/2006 |
| JP | 2009-111287 | 5/2009 |

OTHER PUBLICATIONS

Notice of Reasons for Rejection mailed by Japan Patent Office on Jan. 19, 2010 in the corresponding Japanese patent application No. 2008-304695.
Explanation of Non-English Language References.

* cited by examiner

*Primary Examiner* — Jeremy C Norris
(74) *Attorney, Agent, or Firm* — Knobbe, Martens, Olson & Bear LLP

(57) ABSTRACT

According to one embodiment, a printed wiring board includes an insulating layer, a first conductor pattern on the insulating layer configured to be a signal line, and a second conductor pattern on the insulating layer. The second conductor pattern includes a larger conductor area than the first conductor pattern, and a slit which allows the second conductor pattern to stretch to follow a thermal expansion of the insulating layer.

4 Claims, 5 Drawing Sheets

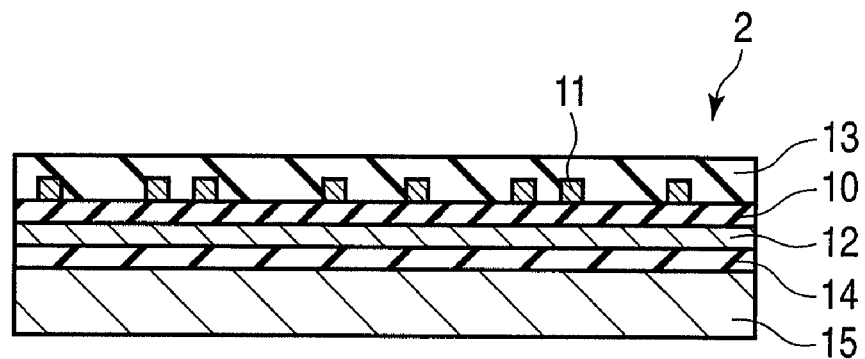
F I G. 2
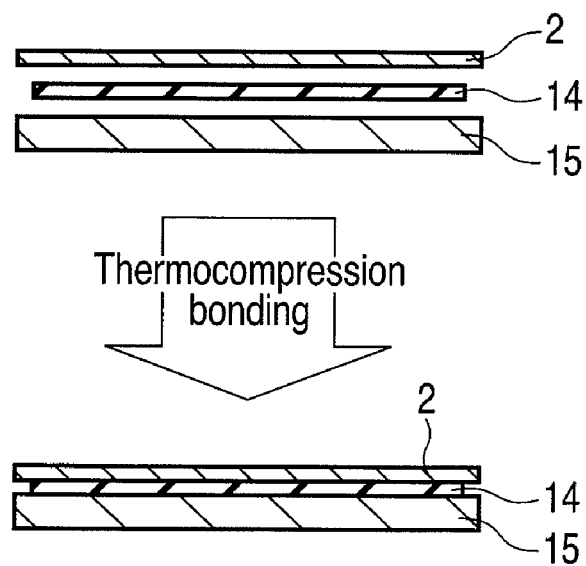
F I G. 3

PRINTED WIRING BOARD AND ELECTRONIC APPARATUS

CROSS-REFERENCE TO RELATED APPLICATIONS

This application is based upon and claims the benefit of priority from Japanese Patent Application No. 2008-304695, filed Nov. 28, 2008, the entire contents of which are incorporated herein by reference.

BACKGROUND

1. Field

One embodiment of the invention relates to a technique associated with a printed wiring board.

2. Description of the Related Art

Many printed wiring boards are each constituted of a plurality of members different from each other in thermal expansion coefficient. As a result, in a printed wiring board, internal stress occurs at the time of reflow, and a warp is caused in some cases.

In Japan Pat. Application KOKAI Publication No. 2006-278747, a flexible printed wiring board with a reinforcing plate in which a warp due to heat is restrained from occurring by the reinforcing plate is disclosed. The reinforcing plate comprises cylindrical holes uniformly arranged at predetermined intervals in such a manner that glass fibers in the reinforcing plate are cut into lengths of 15 mm or less.

Incidentally, it is desired that a warp be restrained from occurring in the printed wiring board.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 2 is an exemplary cross-sectional view of a printed wiring board according to the first embodiment of the present invention;

FIG. 3 is an exemplary view showing a thermocompression bonding process of a reinforcing plate;

DETAILED DESCRIPTION

Various embodiments according to the invention will be described hereinafter with reference to the accompanying drawings. In general, according to one embodiment of the invention, a printed wiring board comprises (i) an insulating layer, (ii) a first conductor pattern on the insulating layer configured to be a signal line, and (iii) a second conductor pattern on the insulating layer comprising a larger conductor area than the first conductor pattern, and a slit which allows the second conductor pattern to stretch to follow a thermal expansion of the insulating layer.

In general, according to one embodiment of the invention, an electronic apparatus comprises a housing, and a printed wiring board in the housing. The printed wiring board comprises (i) an insulating layer, (ii) a first conductor pattern on the insulating layer, the first conductor pattern being a signal line, and (iii) a second conductor pattern on the insulating layer. The second conductor pattern comprises a larger conductor area than the first conductor pattern, and a slit which allows the second conductor pattern to stretch to follow a thermal expansion of the insulating layer.

Embodiments of the present invention will be described below on the basis of drawings in which the invention is applied to a portable computer.

First Embodiment

Figure 1:
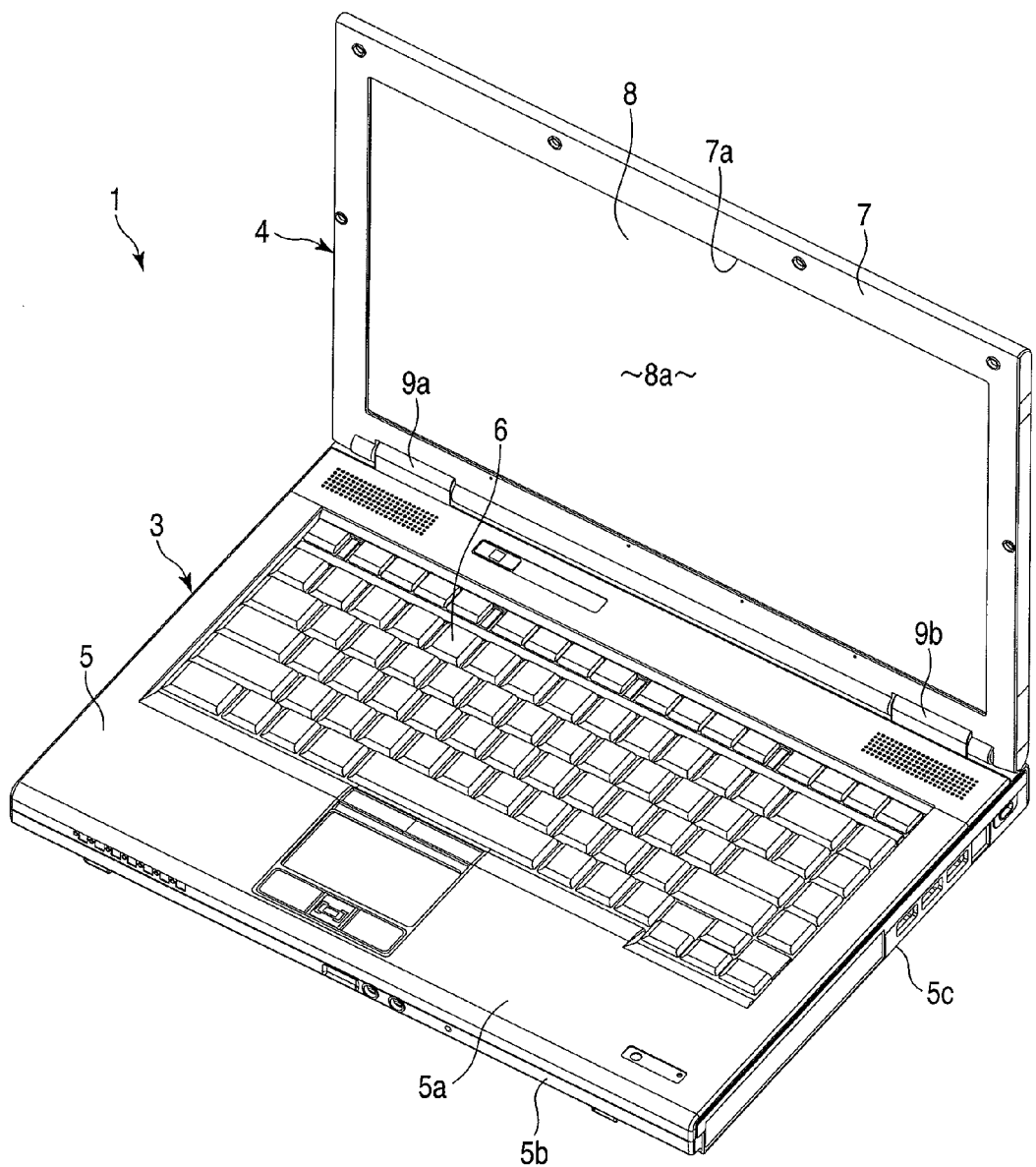
FIG. 1 is an exemplary perspective view of a portable computer according to a first embodiment of the present invention.

FIGS. 1 to 4 disclose a portable computer 1 serving as an electronic apparatus and a printed wiring board 2 according to a first embodiment of the present invention. As shown in FIG. 1, the portable computer 1 comprises a main unit 3 which is an apparatus main body, and display unit 4.

The main unit 3 comprises a housing 5. The housing 5 is formed into a flat box-like shape comprising an upper wall 5a, peripheral wall 5b, and lower wall 5c. The upper wall 5a supports a keyboard 6.

As shown in FIG. 1, the display unit 4 comprises a display housing 7, and display panel 8 contained in the display housing 7. The display panel 8 comprises a display screen 8a. The display screen 8a is exposed to the outside of the display housing 7 through an opening section 7a in the front of the display housing 7.

The display unit 4 is supported on a rear end part of the housing 5 by way of, for example, a pair of hinge sections 9a and 9b. The display unit 4 is rotatable between a closed position in which the unit 4 is laid down to cover the upper wall 5a of the housing 5 from above, and an opened position in which the unit 4 is raised up with respect to the upper wall 5a.

The housing 5 contains a circuit board (printed circuit board). This circuit board comprises a printed wiring board 2 shown in FIG. 2, and various electronic components (not shown) mounted on the printed wiring board 2.

The printed wiring board 2 is a flexible printed wiring board with a reinforcing plate. As shown in FIG. 2, the printed wiring board 2 comprises an insulating layer 10, first conductor pattern 11, second conductor pattern 12, and coverlay 13. A bonding sheet 14, and reinforcing plate 15 are attached to the printed wiring board 2.

The insulating layer 10 is a base material of the printed wiring board 2, and is an insulating film having flexibility and insulating properties. The insulating layer 10 is formed of a plastic film such as a polyimide material and polyester material.

The first conductor pattern 11 (i.e., first conductor layer) is laid on the insulating layer 10. The first conductor pattern 11 is a line (i.e., a signal wiring) configured to be a signal line. To be more precise, the first conductor pattern 11 is an aggregate of wiring positioned at one layer (i.e., first layer) of the printed wiring board 2. The first conductor pattern 11 is formed of, for example, copper foil. The first conductor pattern 11 is, as described above, a signal line, and the conductor area is relatively small.

The second conductor pattern 12 (i.e., second conductor layer) is laid on the insulating layer 10. The second conductor pattern 12 is laid at a layer different from that of the first conductor pattern 11. That is, the second conductor pattern 12 is positioned at another layer (i.e., second layer) of the printed wiring board 2. The second conductor pattern 12 is laid on, for example, the opposite side of the first conductor pattern 11 with respect to the insulating layer 10.

The second conductor pattern 12 is a conductor layer spreading into a sheet-like form at the second layer. The second conductor pattern 12 is a so-called sheet layer, and has a relatively large conductor area. The second conductor pattern 12 is configured to be the power source layer or ground layer, and functions as, for example, a shield layer for shielding the wiring from noise.

The second conductor pattern 12 comprises a larger conductor area than the first conductor pattern 11. The second conductor pattern 12 is, for example, an inner layer conductor provided inside the printed wiring board 2. However, the second conductor pattern 12 may be positioned at the surface layer (i.e., surface) of the printed wiring board 2. The thickness of the second conductor pattern 12 is, for example, 20 to 30 μm. The second conductor pattern 12 is formed of, for example, copper foil. It should be noted that the first and second conductor patterns 11 and 12 may be formed of materials other than copper foil, for example, various types of metallic foil.

The coverlay 13 is laid on, for example, the first conductor pattern 11, and covers the first conductor pattern 11. The coverlay 13 is an insulating film for protecting the first conductor pattern 11.

The reinforcing plate 15 is attached to the printed wiring board 2, and imparts stiffness necessary for, for example, mounting an electronic component to the printed wiring board 2. The reinforcing plate 15 is formed of a glass-cloth resin material such as FR-4 and the like. A bonding sheet 14 is interposed between the reinforcing plate 15 and the printed wiring board 2. As shown in FIG. 3, the printed wiring board 2, bonding sheet 14, and reinforcing plate 15 are laid one on top of another to be subjected to thermocompression bonding, whereby the reinforcing plate 15 is stuck to the printed wiring board 2.

Next, the second conductor pattern 12 according to this embodiment will be described below in detail.

Figure 4:
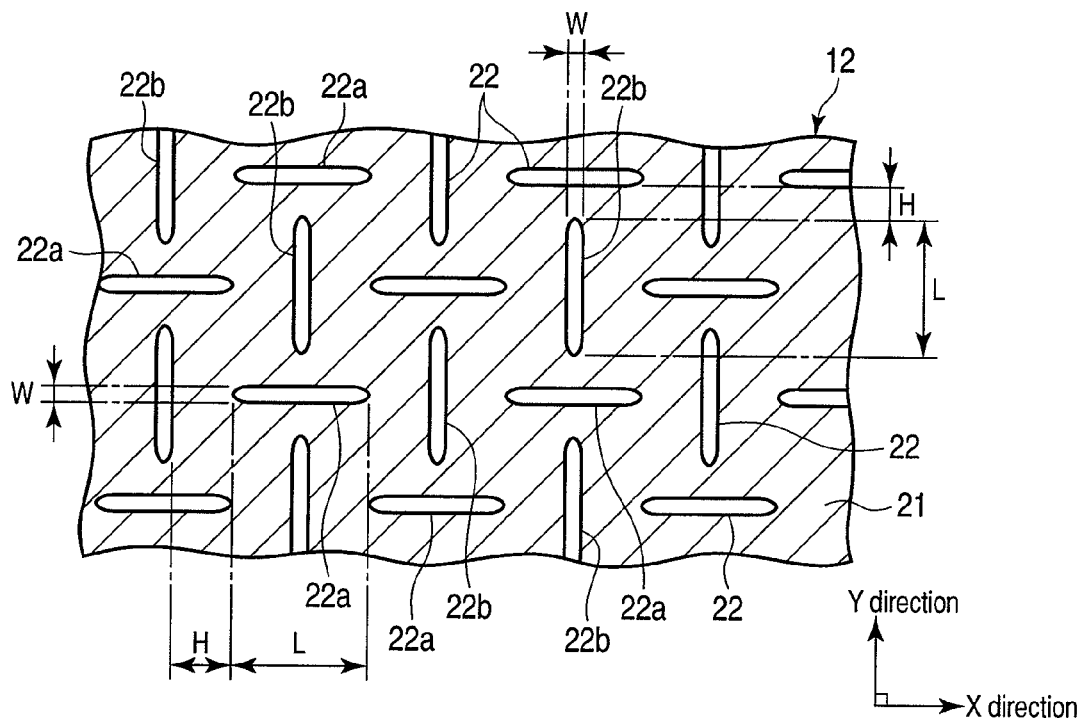
FIG. 4 is an exemplary cross-sectional view of a second conductor pattern of the first embodiment of the present invention.

As shown in FIG. 4, the second conductor pattern 12 comprises a conductor layer 21 (i.e., inner layer conductor) spreading into a surface-form, and a plurality of slits (i.e., gaps) 22 provided in the conductor layer 21. Each of the plurality of slits 22 is an I-shaped slit extending in each direction. The plurality of slits 22 comprise a plurality of first slits 22a, and a plurality of second slits 22b. The first slit 22a is "a slit" mentioned in the present invention. The second slit 22b is "second slit" mentioned in the present invention. Each of the first and second slits 22a and 22b is a gap having an elongated shape in a plan view. The first and second slits 22a and 22b each penetrate the conductor layer 21.

The first slit 22a extends in the lateral direction (i.e., X direction) in FIG. 4. The second slit 22b extends in a direction intersecting (for example, a direction perpendicularly intersecting) the first slit 22a. The second slit 22b extends in, for example, the longitudinal direction (i.e., Y direction) in FIG. 4. That is, the first and second slits 22a and 22b extend in the directions different from each other. It should be noted that the first and second slits 22a and 22b do not necessarily extend in directions perpendicular to each other, and the angle formed between the slits 22a and 22b may be, for example, 45° or other angles.

It should be noted that the position, shape, size, and the like of the first and second slits 22a and 22b are not affected by the first conductor pattern 11. That is, the first and second slits 22a and 22b are arbitrarily provided without consideration of the shape and the like of the first conductor pattern. The first and second slits 22a and 22b are uniformly provided over the entire area of, for example, the second conductor pattern 12.

In an example of the size of the first and second slits 22a and 22b, the length L is 10 mm or more, and width W is 0.2 mm or less. It should be noted that the width W is set at, for example, the slit formation minimum limit value.

The first and second slits 22a and 22b allow the second conductor pattern 12 to stretch and shrink to follow the thermal expansion and contraction of the insulating layer 10. More specifically, the first slit 22a allows the second conductor pattern 12 to stretch and shrink in the longitudinal direction (i.e., Y direction) in FIG. 4. The second slit 22b allows the second conductor pattern 12 to stretch and shrink in the lateral direction (i.e., X direction) in FIG. 4.

As shown in FIG. 4, the first and second slits 22a and 22b are arranged, for example, alternately in the longitudinal and lateral directions, and are arrayed in a grid-like form. The plurality of first slits 22a and plurality of second slits 22b are arranged separate from each other. That is, the plurality of first slits 22a are arranged separate from each other. The plurality of second slits 22b are arranged separate from each other. All the first slits 22a and second slits 22b are arranged separate from each other. That is, all the slits 22 are independent of each other, and are not connected to other slits 22. In other words, each of the slits 22 is surrounded by the conductor layer 21 all around the periphery thereof.

An interval H between the first and second slits 22a and 22b is adjusted in accordance with an amount of a current (necessary current value) flowing through the part between the first and second slits 22a and 22b.

Next, the function of the printed wiring board 2 will be described below.

The reinforcing plate 15 is bonded to the printed wiring board 2 by thermocompression at a high temperature of, for example, 160° C. Here, the various members 10, 11, and 12 constituting the printed wiring board 2, bonding sheet 14, and reinforcing plate 15 are different from each other in thermal expansion coefficient. Examples of thermal expansion coefficient are as follows. A thermal expansion coefficient of the polyimide material (i.e., insulating layer 10) is $27 \times 10^{-6}$/°C, that of the copper foil (i.e., first and second conductor patterns 11 and 12) is $16.8 \times 10^{-6}$/°C, that of the bonding sheet 14 is 30 to $35 \times 10^{-6}$/°C, and that of the glass cloth of the glass-cloth resin material (i.e., reinforcing plate 15) is $45 \times 10^{-6}$/°C.

Among the above members, the thickness of the reinforcing plate 15 is relatively large, and hence the thermal expansion and contraction of the reinforcing plate 15 becomes predominant. Further, among the above members, the thermal expansion coefficient of the copper foil is the smallest. Here, in the first conductor pattern 11 configured to be the signal line, the conductor area is relatively small, and hence the pattern 11 is less affected. On the other hand, in the second conductor pattern 12 which is a so-called sheet-like layer, the conductor area is relatively large (i.e., the copper area ratio is high), and hence the pattern 12 is largely affected.

That is, the second conductor pattern 12 does not largely exhibit thermal expansion and contraction. Accordingly, at the time of reflow or after the lamination cooling, the second conductor pattern 12 is pulled by the expansion of the reinforcing plate 15 and is pushed by the contraction of the reinforcing plate 15.

Here, the second conductor pattern 12 according to this embodiment comprises the first and second slits 22a and 22b. Accordingly, when the reinforcing plate 15 expands, the first and second slits 22a and 22b open, whereby the second conductor pattern 12 stretches to follow the expansion of the reinforcing plate 15. Further, when the reinforcing plate 15 contracts, the first and second slits 22a and 22b close, whereby the second conductor pattern 12 shrinks to follow the contraction of the reinforcing plate 15. As a result of this, internal stress hardly occurs in the printed wiring board 2 (that is, the internal stress can be relieved), and the warp of the printed wiring board 2 is restrained.

According to the printed wiring board 2 configured as described above, it is possible to restrain the printed wiring board 2 and reinforcing plate 15 from being warped. That is, in the case where the second conductor pattern 12 which is a sheet-like layer comprises slits 22, it is possible for the second conductor pattern 12 to stretch and shrink to follow the thermal expansion and contraction of the reinforcing plate 15 and the other members. This makes an internal stress hardly occur in the printed wiring board 2, and makes a warp hardly occur in the printed wiring board 2 and reinforcing plate 15.

Furthermore, as described above, among the members 10, 11, and 12 constituting the printed wiring board 2, bonding sheet 14, and reinforcing plate 15, the thermal expansion coefficient of the second conductor pattern 12 is the smallest. The follow-up capability of the second conductor pattern 12 the thermal expansion coefficient of which is the smallest is improved as described above, thereby making a warp hardly occur in the printed wiring board 2 and reinforcing plate 15.

Here, it is a conceivable way to provide cylindrical holes in the reinforcing plate in order to restrain the warp. However, the reinforcing plate is much thicker than the printed wiring board. For this reason, if holes are formed in the reinforcing plate, the holes are relatively deep. Further, when the printed wiring board (e.g., flexible printed wiring board) and the reinforcing plate are bonded together by compression, part of the printed wiring board falls in the holes, and the printed wiring board becomes partially concave. If the flatness of the printed wiring board is deteriorated, the mounting accuracy of the component is lowered.

Further, if the holes are provided in the reinforcing plate, the strength of the reinforcing plate is reduced, and hence there is the possibility of the function of the reinforcing plate being lowered. Furthermore, a cylindrical hole is hardly deformed (i.e., hardly stretched), and hence the follow-up capability of the reinforcing plate is not high with respect to the printed wiring board.

On the other hand, the thickness of the second conductor pattern 12 is, for example, 20 to 30 μm, this being smaller than that of the reinforcing plate 15. Accordingly, although the slits 22 are provided in the second conductor pattern 12, the slits do not substantially affect the flatness of the printed wiring board 2. Accordingly, the mounting accuracy of the component is not substantially lowered.

In the case where the second conductor pattern 12 comprises the first and second slits 22a and 22b extending in directions different from each other, the printed wiring board 2 is stretchable and shrinkable not only in one direction but also in a plurality of directions (for example, in the longitudinal and lateral directions). This further makes an internal stress hardly occur in the printed wiring board 2, and further makes a warp hardly occur in the printed wiring board 2.

In the case where the first and second slits 22a and 22b are arranged alternately, it becomes easy to secure the follow-up capability in the plurality of directions over the entire area of the second conductor pattern.

First Modification Example of First Embodiment

Next, a first modification example of the first embodiment will be described below with reference to FIGS. 5 to 7.

Figure 5:
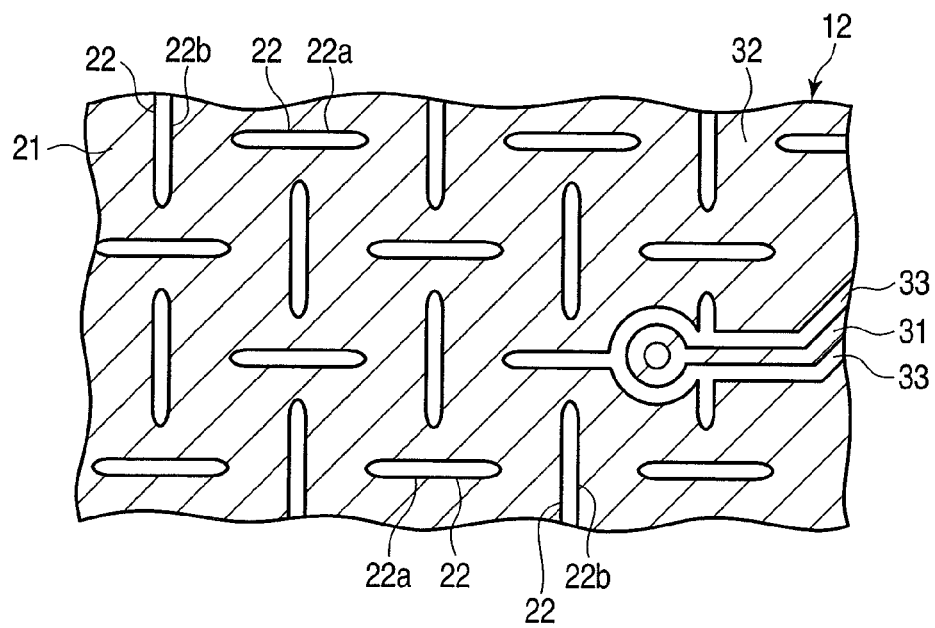
FIG. 5 is an exemplary cross-sectional view showing a first modification example of the second conductor pattern of the first embodiment.

As shown in FIG. 5, part of a second conductor pattern 12 comprises a line 31 (hereinafter referred to as a signal line 31) configured to be a signal line. That is, the second conductor pattern 12 comprises a main section 32 configured to be the power source or ground, and the signal line 31. This signal line 31 is, for example, inner layer signal line. A predetermined clearance 33 (i.e., clearance for insulation) is provided between the main section 32 of the second conductor pattern 12 and the signal line 31.

All of first slits 22a and second slits 22b are arranged separate from each other. That is, all the slits 22 are independent of each other, and are not connected to other slits. In other words, each of the slits is surrounded by a conductor layer 21 all around the periphery thereof.

The first and second slits 22a and 22b are arranged in the same arrangement style (that is, the same way of arranging, and at the same intervals) in an area adjacent to the signal line 31, and in areas separate from the signal line 31. Further, the first and second slits 22a and 22b adjacent to the signal line 31 are formed shorter in length to avoid the signal line 31.

In other words, the pattern in which the first and second slits 22a and 22b are uniformly provided is overwritten with the signal line 31 and clearance 33, whereby the second conductor pattern 12 according to this modification example is formed.

According to the printed wiring board 2 configured as described above, the design of the wiring layout is facilitated. That is, in the case where the second conductor pattern 12 comprising the signal line 31 is designed, it is possible to arrange the first and second slits 22a and 22b without caring about the presence or absence of the signal line 31. More specifically, even if the first and second slits 22a and 22b are formed shorter in length to avoid the signal line 31, the second conductor pattern 12 is not largely affected. Accordingly, the first and second slits 22a and 22b are arranged first, and thereafter the resultant pattern is overwritten with the signal line 31 and clearance 33 by using a function (i.e., inner layer edit function) of PCB-CAD or the like, whereby it is possible to design the second conductor pattern 12 without the need for special editing.

It should be noted that the shape of the slit may be an L-shape (see FIG. 7) formed by connecting the first and second slits 22a and 22b to each other. However, as shown in FIG. 7, in the case of a slit of the L-shape or cross-shape, a part surrounded by the first and second slits 22a and 22b, and clearance 33 becomes an isolated conductor 35. The isolated conductor 35 is electrically disconnected from a large part of the second conductor pattern 12. Such an isolated conductor 35 does not function as the power source or ground, and hence lowers the electric characteristics of the printed wiring board 2. Furthermore, the isolated conductor 35 functions as an antenna, thereby causing noise. It is therefore desirable that the isolated conductor 35 be as small and little as possible.

Figure 6:
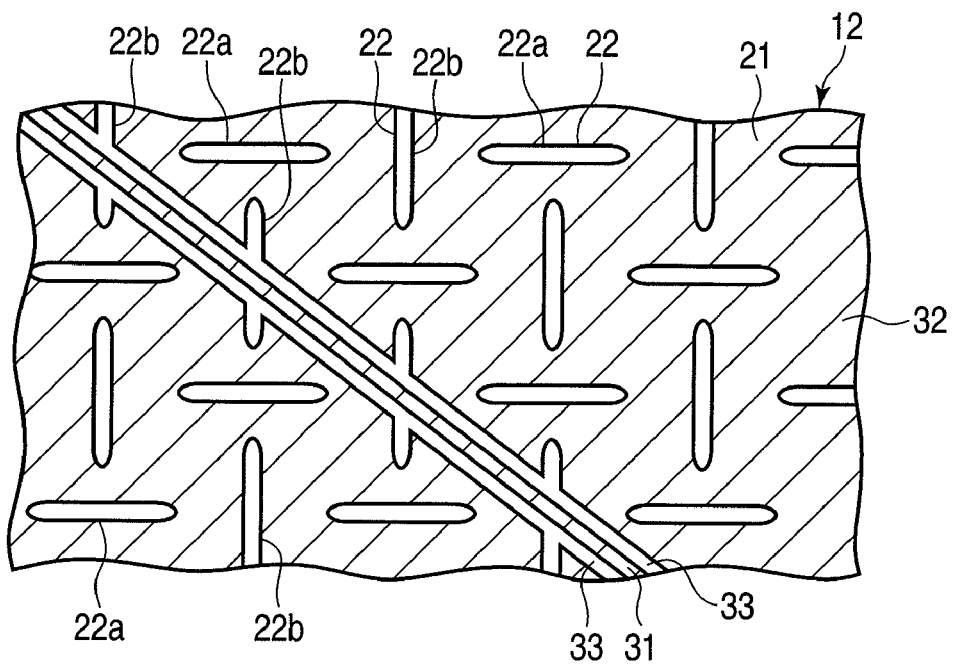
FIG. 6 is an exemplary cross-sectional view showing the first modification example of the second conductor pattern of the first embodiment.
Figure 7:
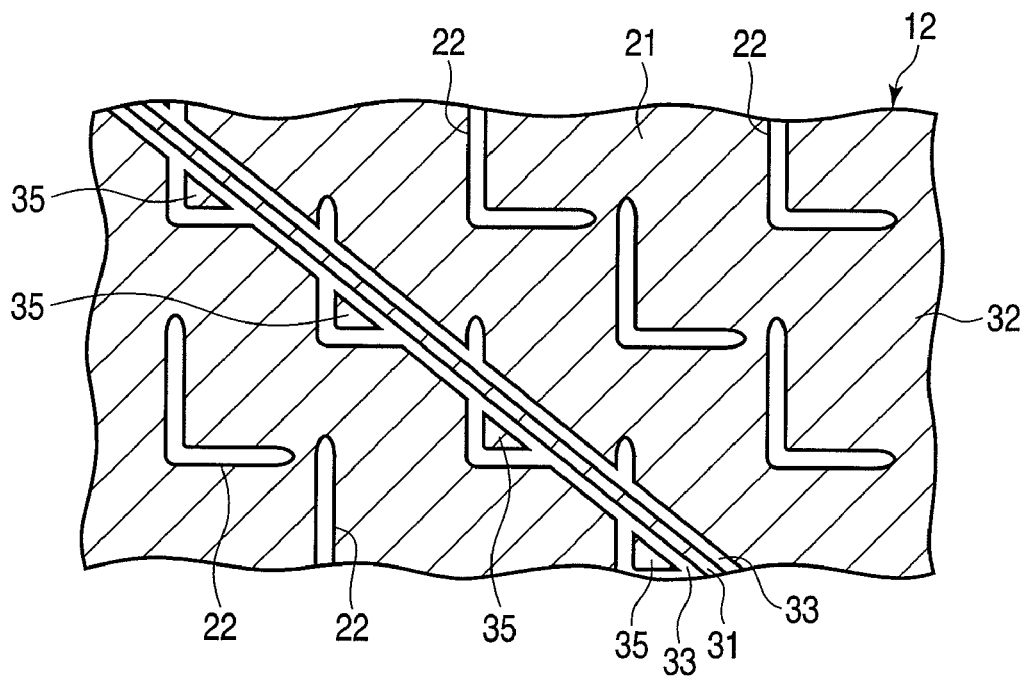
FIG. 7 is an exemplary cross-sectional view showing the first modification example of the second conductor pattern of the first embodiment.

Here, in the case where, as shown in FIG. 6, the first and second slits 22a and 22b are arranged separate from each other, i.e., the plurality of slits extending in the different directions are arranged separate from each other, the isolated conductor 35 is hardly formed. As for such a printed wiring board 2, the electric characteristics are excellent, and noise is made less.

Second Modification Example of First Embodiment

Next, a second modification example of the first embodiment will be described below with reference to FIG. 8.

Figure 8:
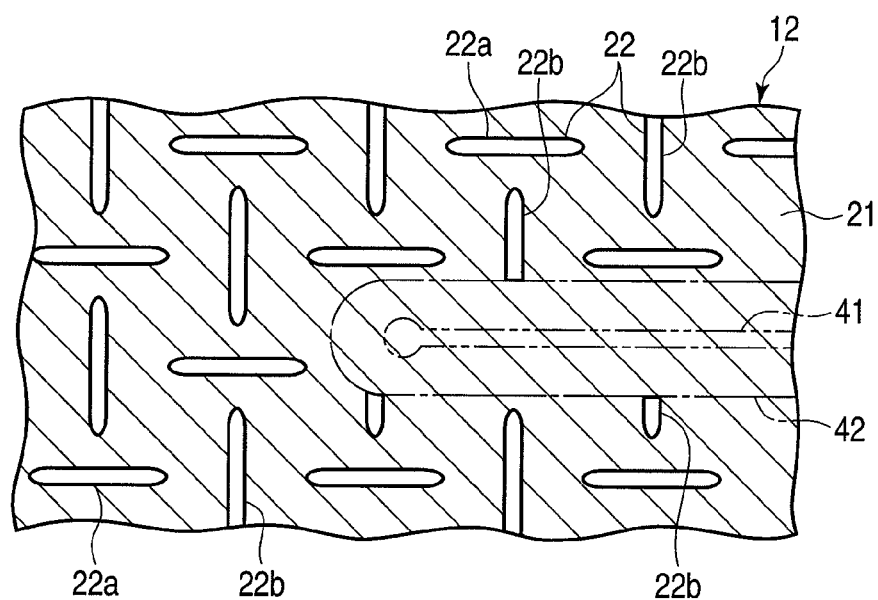
FIG. 8 is an exemplary cross-sectional view showing a second modification example of the second conductor pattern of the first embodiment.

As shown in FIG. 8, a printed wiring board 2 comprises an impedance line 41. The impedance line 41 is part of a first conductor pattern 11. A second conductor pattern 12 is the ground. The impedance line 41 is a line through which a signal (for example, a high-speed signal) referring to the second conductor pattern 12 (i.e., reference layer) flows.

As shown in FIG. 8, the second conductor pattern 12 comprises a reference area 42 in an area opposed to the impedance line 41. The reference area 42 is an area referred to by the impedance line 41. The first and second slits 22a and 22b adjacent to this reference area are formed shorter in length to avoid the reference area 42.

According to such a printed wiring board 2, the signal flowing through the impedance line 41 becomes stable, and the design of the wiring layout of the printed wiring board 2 is facilitated. That is, in the case where the second conductor pattern 12 comprising the reference area 42 is designed, it is possible to arrange the first and second slits 22a and 22b without minding the presence or absence of the signal line 31. More specifically, even if the first and second slits 22a and 22b are formed shorter in length to avoid the reference area 42, the second conductor pattern 12 is not largely affected. Accordingly, the first and second slits 22a and 22b are arranged first, and thereafter the resultant pattern is overwritten with the reference area 42 by using a function (i.e., inner layer edit function) of PCB-CAD or the like, whereby it is possible to design the second conductor pattern 12 without the need for special editing.

Second Embodiment

Figure 9:
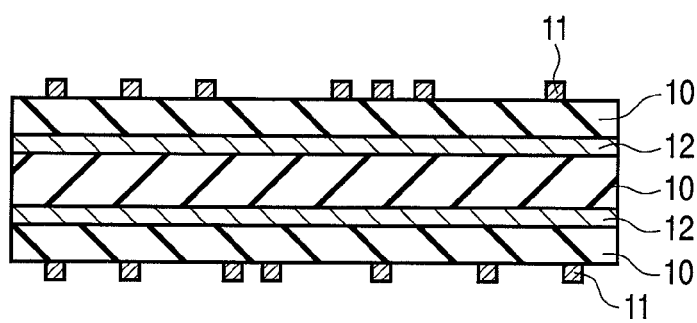
FIG. 9 is an exemplary cross-sectional view of a printed wiring board according to a second embodiment of the present invention.

Next, a portable computer 1 serving as an electronic apparatus and printed wiring board 2 according to a second embodiment of the present invention will be described below with reference to FIG. 9. It should be noted that the configuration comprising a function identical with or similar to that of the configuration of the first embodiment is denoted by the reference symbol identical with that of the first embodiment, and a description thereof is omitted. The remaining parts of the configurations of the printed wiring board 2 and portable computer 1 other than those to be described below are identical with those of the first embodiment described above.

The printed wiring board 2 is, as in, for example, the first embodiment, contained in a housing 5 of the portable computer 1. As shown in FIG. 9, the printed wiring board 2 according to this embodiment is a rigid board. The printed wiring board 2 comprises, for example, three insulating layers 10, two first conductor patterns 11, and two second conductor patterns 12. The insulating layer 10 according to this embodiment is, for example, a glass epoxy resin material. It should be noted that although, for example, a four-layer board is disclosed in FIG. 9 as an example of the present invention, the printed wiring board according to the present invention is not limited to this.

Next, the function of the printed wiring board 2 will be described below.

The members 10, 11, and 12 constituting the printed wiring board 2 are bonded to each other by thermocompression at a high temperature. Here, the various members 10, 11, and 12 constituting the printed wiring board 2 are different from each other in thermal expansion coefficient. Among the above members, the thickness of the insulating layer 10 is relatively large, and hence the thermal expansion and contraction of the insulating layer 10 becomes predominant. Further, among the above members, the thermal expansion coefficient of the second conductor pattern 12 is the smallest. Accordingly, at the time of reflow or after the lamination cooling, the second conductor pattern 12 is pulled by the expansion of a reinforcing plate 15 and is pushed by the contraction of the reinforcing plate 15.

Here, the second conductor pattern 12 according to this embodiment comprises first and second slits 22a and 22b. Accordingly, when the insulating layer 10 expands, the first and second slits 22a and 22b open, whereby the second conductor pattern 12 stretches to follow the expansion of the insulating layer 10. Further, when the insulating layer 10 contracts, the first and second slits 22a and 22b close, whereby the second conductor pattern 12 shrinks to follow the contraction of the insulating layer 10. As a result of this, internal stress hardly occurs in the printed wiring board 2 (that is, the internal stress can be relieved), and the warp of the printed wiring board 2 is restrained. That is, according to the printed wiring board 2 configured as described above, it is possible to restrain the printed wiring board 2 from being warped as in the first embodiment described previously.

Third Embodiment

Next, a portable computer 1 serving as an electronic apparatus and printed wiring board 2 according to a third embodiment of the present invention will be described below with reference to FIG. 10. It should be noted that the configuration comprising a function identical with or similar to that of the configuration of the second embodiment is denoted by the reference symbol identical with that of the second embodiment, and a description thereof is omitted. The remaining parts of the configurations of the printed wiring board 2 and portable computer 1 other than those to be described below are identical with those of the second embodiment described above.

Figure 10:
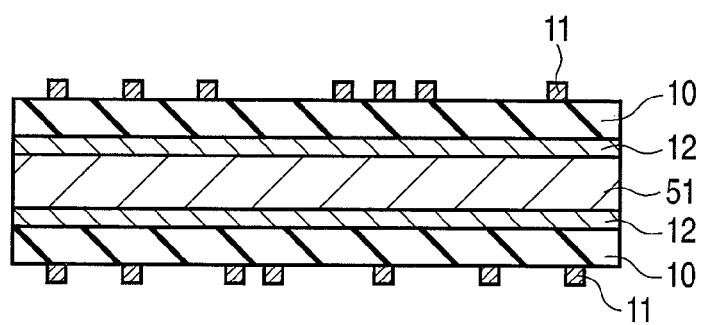
FIG. 10 is an exemplary cross-sectional view of a printed wiring board according to a third embodiment of the present invention.

As shown in FIG. 10, the printed wiring board 2 according to this embodiment is a rigid board comprising a metal core 51. An example of the metal core 51 is an aluminum core or copper core.

According to the printed wiring board 2 configured as described above, it is possible to restrain the printed wiring board 2 from being warped as in the second embodiment described previously. That is, if the second conductor pattern comprises the slits 22, it is possible for the second conductor pattern 12 to stretch and shrink to follow the thermal expansion and contraction of the metal core 51 and the other members. This makes an internal stress hardly occur in the printed wiring board 2, and makes a warp hardly occur in the printed wiring board 2.

The printed wiring board 2 and portable computer 1 according to each of the first to third embodiments have been described above. However, the present invention is not limited to these. The present invention is not limited to the embodiments described above as they are. In the implementation stage, the constituent elements can be modified and embodied within the scope not deviating from the gist of the invention. Further, appropriate combination of a plurality of constituent elements disclosed in the embodiments described above enables various inventions to be formed. For example, some constituent elements may be omitted from all the constituent elements shown in the embodiments. Furthermore, constituent elements ranging over different embodiments may be appropriately combined.

It goes without saying that the structure according to each of the first and second modification examples of the first embodiment is employable in the second and third embodiments. The slits 22 are not necessarily provided over the entire area of the second conductor pattern 12, and may also be provided, for example, partially in the second conductor pattern 12. The slits 22 may also be provided partially in the second conductor pattern 12 in such a manner that the slits correspond to, for example, the outer dimension of a mounted component or the corner of the component (that is, the slits correspond to a part most subject to the stress).

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A printed wiring board comprising:
an insulating layer;
a first conductor pattern on the insulating layer configured to be a signal line; and
a second conductor pattern on the insulating layer, the second conductor pattern comprising a main portion configured to be a power source layer or a ground layer, a conductor line configured to be a signal line, a clearance between the main portion and the conductor line, a plurality of first slits, and a plurality of second slits extending in a direction intersecting the first slits,
the first slits and the second slits being uniformly provided in an area which comprises the conductor line and an area which does not comprise the conductor line, and the first slit and the second slit next to the conductor line being shorter in length in order to avoid the conductor line and being connected to the clearance, and
the first slits and the second slits being separate from one another and aligned alternately.

2. The printed wiring board of claim 1, wherein
the first conductor pattern comprises an impedance line,
the second conductor pattern comprises a reference area facing the impedance line, and the first slits and second slits next to the reference area are shorter in length in order to avoid the reference area.

3. The printed wiring board of claim 1, wherein
the insulating layer has a larger thermal expansion coefficient than the second conductor pattern, and
the first slits and the second slits are configured to open when the insulating layer expands, and the second conductor pattern is configured to follow the expansion of the insulating layer.

4. The printed wiring board of claim 1, wherein
a reinforcing plate having a larger thermal expansion coefficient than the second conductor pattern is attached to the printed wiring board, and
the first slits and the second slits are configured to open when the reinforcing plate expands, and the second conductor pattern is configured to follow the expansion of the reinforcing plate.

* * * * *